(12) United States Patent
Culler

(10) Patent No.: US 7,046,057 B1
(45) Date of Patent: May 16, 2006

(54) SYSTEM AND METHOD FOR SYNCHRONIZING DEVICES

(75) Inventor: Jason Harold Culler, Livermore, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 51 days.

(21) Appl. No.: 10/699,906

(22) Filed: Nov. 3, 2003

(51) Int. Cl.
*H03L 7/00* (2006.01)

(52) U.S. Cl. ...................... 327/156; 375/376

(58) Field of Classification Search ................ 327/141, 327/144–153, 155–163; 375/371–376; 713/400, 713/401, 500–503
See application file for complete search history.

(56) References Cited

U.S. PATENT DOCUMENTS

| | | | |
|---|---|---|---|
| 5,459,435 A * | 10/1995 | Taki ........................... 331/1 A |
| 5,465,277 A * | 11/1995 | Schreurs et al. ............ 375/376 |
| 5,774,001 A | 6/1998 | Mozdzen et al. ........... 327/141 |
| 5,808,691 A * | 9/1998 | Malcolm et al. ............ 348/537 |
| 5,923,715 A * | 7/1999 | Ono ........................... 375/376 |
| 6,147,530 A * | 11/2000 | Nogawa ...................... 327/156 |
| 6,255,883 B1 | 7/2001 | Delvaux et al. ............ 327/291 |
| 6,326,826 B1 * | 12/2001 | Lee et al. .................... 327/161 |
| 6,463,547 B1 | 10/2002 | Bailey et al. ............... 713/500 |
| 6,470,458 B1 | 10/2002 | Dreps et al. ................ 713/400 |
| 6,701,445 B1 * | 3/2004 | Majos ......................... 713/500 |
| 2002/0026539 A1 | 2/2002 | Muthukumaraswamy et al. |
| 2002/0053933 A1 | 5/2002 | Takahashi |

* cited by examiner

*Primary Examiner*—Minh Nguyen

(57) ABSTRACT

Systems and methods can be employed to synchronize devices. One embodiment may include a system that includes an input that receives a synchronization signal having a frequency, and an oscillator that provides a clock signal having a frequency. The oscillator adjusts the frequency of the clock signal based on a comparison of an indication of the frequency for the synchronization signal and a corresponding indication of the frequency for the clock signal.

27 Claims, 6 Drawing Sheets

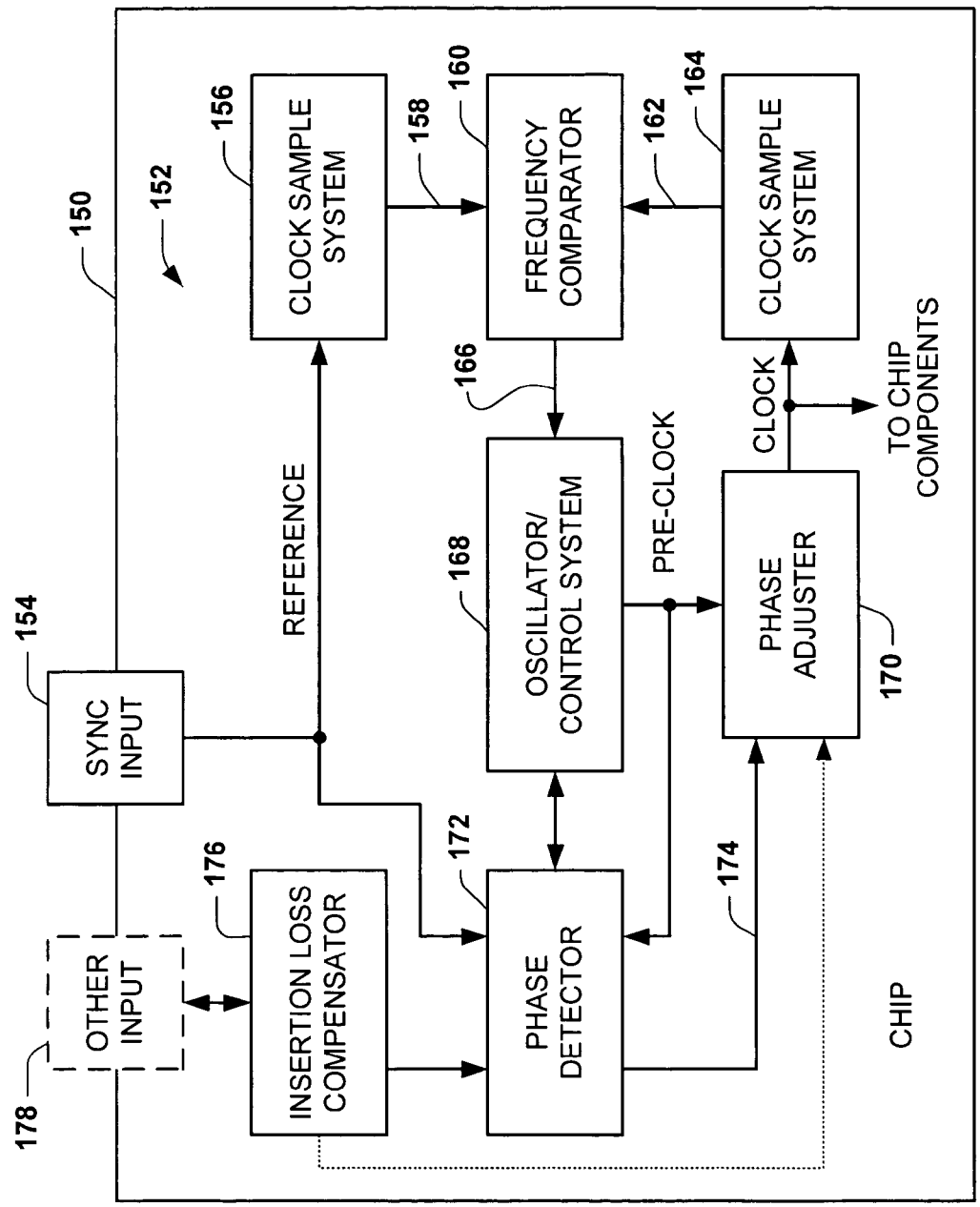

SYSTEM AND METHOD FOR SYNCHRONIZING DEVICES

RELATED APPLICATION

This application is related to co-pending and commonly assigned U.S. patent application to J. Culler, which was filed contemporaneously with this application and entitled SYSTEM AND METHOD FOR WAVEFORM SAMPLING, application Ser. No. 10/699,909, which was filed Nov. 3, 2003, the disclosure of which is incorporated herein by reference.

BACKGROUND

It is often desirable to synchronize two or more electronic devices to facilitate an exchange of data between such devices. Such devices, for example, may include integrated circuit (IC) chips, components or other electronic devices. These and other devices can be coupled to each other in a given circuit board or via other connections over a plurality of circuit boards to form an integrated system. Effective synchronization is needed to enable transfer of data (e.g., input/output (I/O) data) between devices. If the devices are not sufficiently synchronized, the transfer of I/O data can become problematic or, at worst, fail completely.

Various approaches exist to synchronize devices, such as IC chips. Two common approaches are a common clock I/O system and a source synchronous I/O system. A traditional common clock distribution architecture utilizes a common clock source that supplies a clock signal for timing and latching of data. With a common clock system, the clocks at each chip need to be synchronized or timing margin may be compromised. To implement such synchronization, common clock systems usually rely upon board and die solutions implementing a phase-locked loop (PLL) and/or a delay-locked loop (DLL).

In a typical source synchronous I/O system, DLL and PLL circuitry are utilized to generate synchronous strobe information to help latch data at the receiver reliably. While the source synchronous I/O system may employ less complex board designs than the common clock approach, they still utilize complex DLL and PLL circuitry to achieve desired synchronization.

SUMMARY

One embodiment of the present invention may comprise a system that includes an input that receives a synchronization signal having a frequency. An oscillator provides a clock signal having a frequency. The oscillator adjusts the frequency of the clock signal based on a comparison of an indication of the frequency for the synchronization signal and a corresponding indication of the frequency for the clock signal.

Another embodiment of the present invention may comprise a system for synchronizing an integrated circuit (IC) chip. The system includes a first sampling system that provides an indication of the frequency for a synchronization signal received at an input of the IC chip. A second sampling system provides an indication of frequency for an internally generated clock signal. A comparator provides a comparator signal based on a comparison of the indication of frequency for the clock signal and the indication of the frequency for the synchronization signal. A controller provides a control signal for implementing adjustments to the internally generated clock signal based on the comparator signal. An oscillator provides the internally generated clock signal based on the control signal.

Yet another embodiment of the present invention may comprise a method that includes determining an indication of frequency for an input signal provided by an external source and determining an indication of frequency for an internally generated signal. An oscillator is controlled to provide the internally generated signal at a frequency based on a comparison of the indication of frequency for the input signal and the indication of frequency for the internally generated signal.

BRIEF DESCRIPTION OF THE DRAWINGS

FIG. 5 depicts another embodiment of a synchronization system.

DETAILED DESCRIPTION

The following generally describes synchronization of the electronic devices, such as chips, components or other devices that may be electrically connected (e.g., within an integrated system). In one embodiment, one or more devices (e.g., IC chips) receive an external reference for synchronizing the device or devices. The recipient device(s) each includes an oscillator/control block that is operative to generate an internal clock signal for the device. The synchronization input and the internally generated clock signal are sampled to provide an indication of the respective frequencies of external reference signal and the internally generated clock signal. The internally generated clock signal can be adjusted based on a comparison of the frequencies of the respective signals. As a result, desired synchronization can be achieved cost effectively, such as to facilitate transfer of I/O data between devices.

Figure 1:
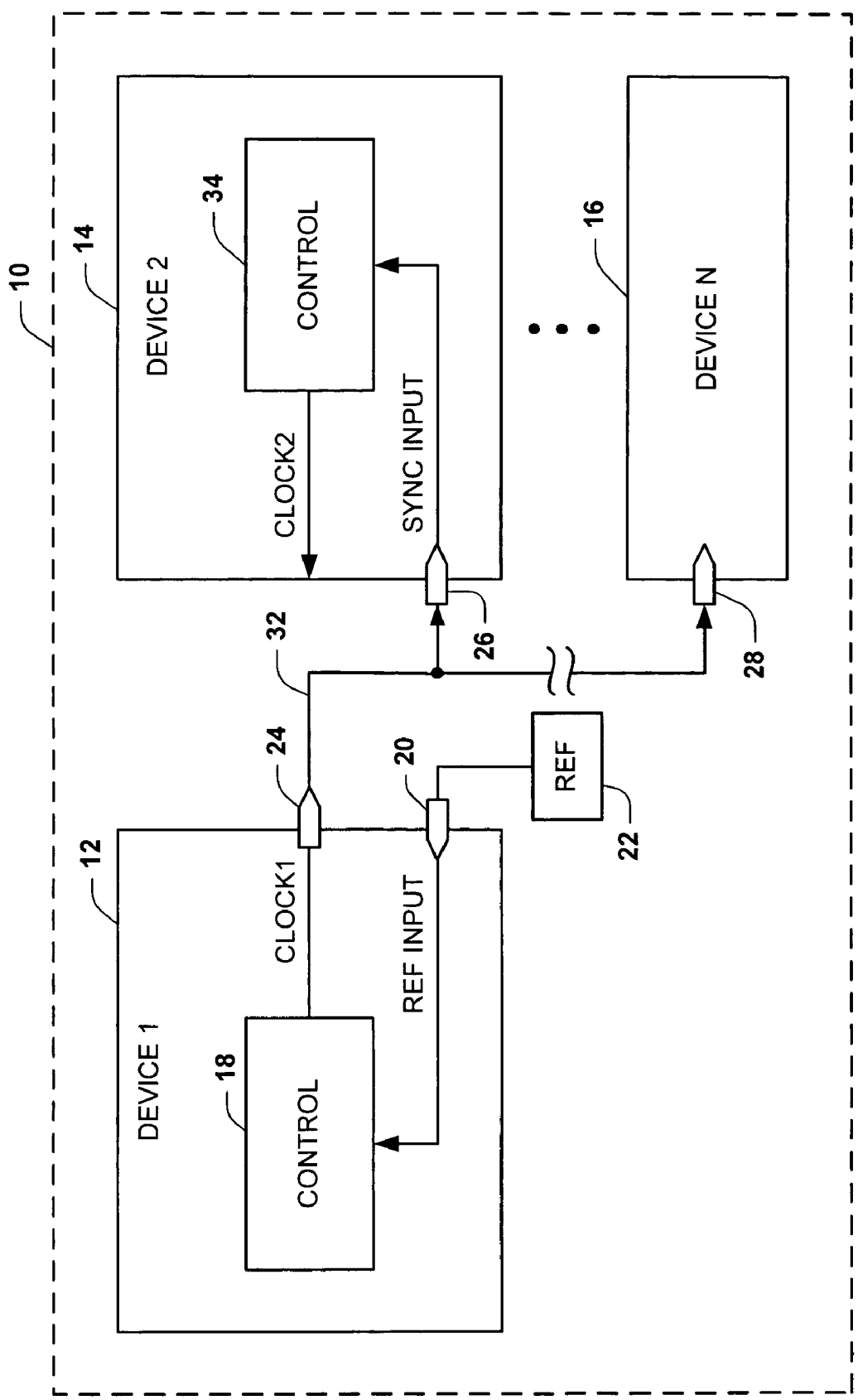
FIG. 1 depicts a block diagram for one embodiment of a synchronization system.

FIG. 1 illustrates of a system 10 that can implement synchronization. The system 10, for example, is a printed circuit board or plural interconnected circuit boards, which includes a plurality of interconnected devices 12, 14 and 16 (indicated respectively at DEVICE 1, DEVICE 2 and DEVICE N, where N is an integer (N≧1). The system 10 can include any number N of devices 14–16. In the example of FIG. 1, the respective devices 12–16 can be integrated circuit (IC) chips or other components desired to be synchronized together.

In the example of FIG. 1, the device 12 operates as a master device in that it provides an output signal (CLOCK1) for synchronizing the other devices 14 and 16 in the system 10. The device 12 includes a control block 18 that is operative to generate the CLOCK1 signal based on a corresponding reference input (REF INPUT) signal. The REF INPUT signal is provided at a corresponding input 20 of the device 12. By way of example, the input 20 can be coupled to an external reference source (REF) 22 that provides a corresponding reference input signal to the device 12. For instance, the reference source 22 can be a fixed potential (e.g., electrical ground), a fixed digital value, or another input signal having a desired reference frequency for synchronizing the system 10.

The device 12 provides the CLOCK1 signal at an output 24, which is coupled to corresponding inputs 26 and 28 in the other devices 14 and 16 of the system 10. The output 24 of the device 12 can be coupled to the inputs 26–28 through a corresponding electrical connection 32, such as a trace, a metal line, a wire or other electrically conductive material. The CLOCK1 signal generated by the control block 18 provides a synchronization input (SYNC INPUT) signal at the other devices 14–16.

Turning to the contents of the device 14, the device includes a control block 34 that receives the SYNC INPUT signal via the input 26. The control block 34 is operative to generate an internal clock signal, indicated at CLOCK2, such as for clocking components internal to the device 14. The control block 34 is programmed and/or configured to determine an indication of the frequency of the SYNC INPUT signal as well as an indication of the frequency of the CLOCK2 signal. The respective indications of frequencies (e.g., digital data indicative of frequency characteristics of the respective signals) can be compared to implement corresponding adjustments to the CLOCK2 signal.

By way of example, the control block 34 includes an oscillator (not shown) that provides the CLOCK2 signal at a frequency adjusted based on a comparison of the frequency information for SYNC INPUT and CLOCK2 signals. Various types of oscillators exist, including, for example, crystal oscillators, RC oscillators, timer multivibrator oscillator circuits, field programmable gate array (FPGA) implemented oscillators and the like. The adjustments can correspond to an increase in the frequency of the CLOCK2 signal or to a decrease in its frequency. Alternatively, if the frequency of the CLOCK2 signal is substantially equal to the SYNC INPUT signal (e.g., within expected operating parameters), the control block 34 may implement no changes to the frequency of the CLOCK2 signal. The other device 16 can be programmed and/or configured to implement similar synchronization to that just described with respect to the device 14.

Thus, it would be understood and appreciated that the synchronization approach just described provides a simplified approach suitable for many applications. Of particular interest, the system 10 can implement acceptable synchronization in the absence of a PLL or other generally expensive hardware. By way of example, the synchronization approach can be implemented for test chips and other test circuitry, such as may be utilized to verify signal integrity, power supply performance and input/output operations of associated circuitry (not shown) in the devices.

Figure 2:
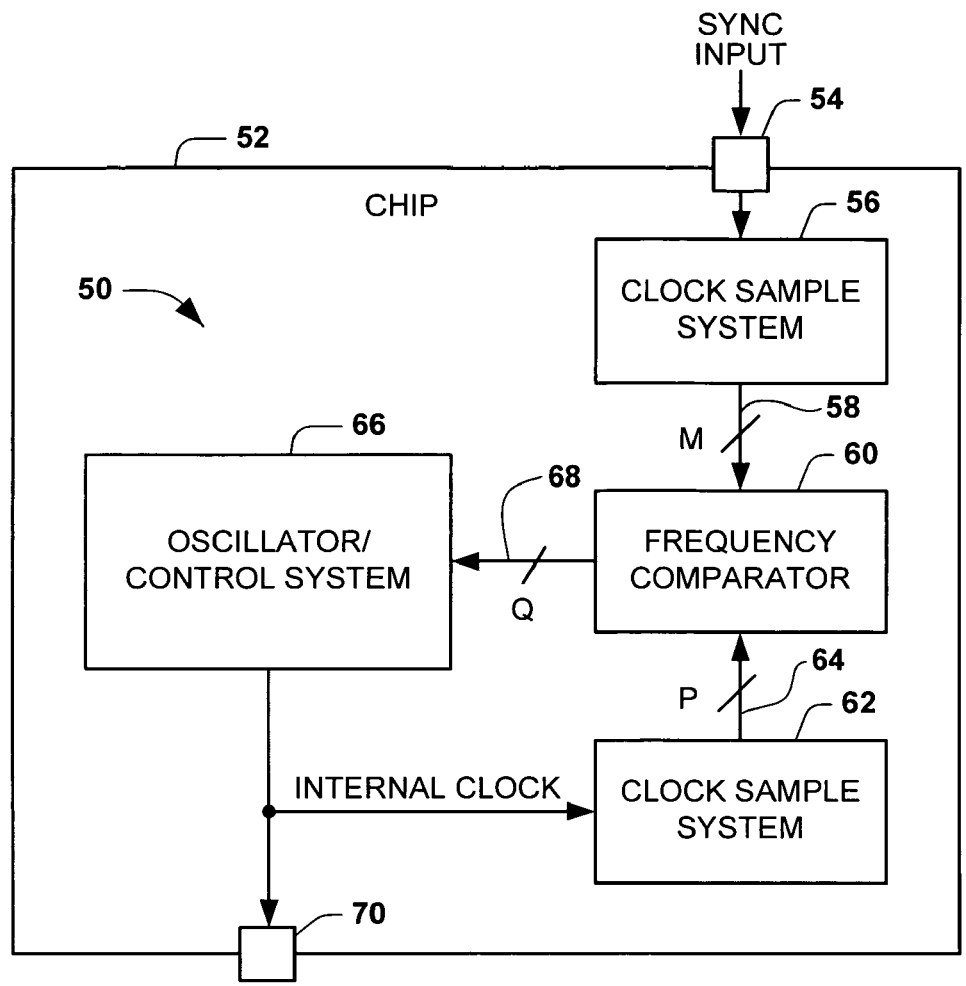
FIG. 2 depicts a chip implementing an embodiment of a synchronization system.

FIG. 2 illustrates an example of a system 50 that can be implemented in an integrated circuit chip 52. The chip 52 receives a synchronization input (SYNC INPUT) signal at an input 54, such as can be provided by another chip or other source (not shown). The SYNC INPUT signal, for example, corresponds to an external clock signal having a frequency to which the chip 52 is to synchronize its own INTERNAL CLOCK signal.

A clock sample system 56 receives the SYNC INPUT signal and provides an output signal 58 having frequency information associated with the SYNC INPUT signal. For example, the clock sample system 56 performs over sampling (e.g., at least four times oversampling) and provides the output signal 58 as an M-bit digital word indicative of such frequency, where M is an integer ($M \geq 1$). A frequency comparator 60 receives the output signal 58 from the clock sample system 56.

Another clock sample system 62 provides an output signal 64 indicative of the frequency of the INTERNAL CLOCK generated by the chip 52. An oscillator/control system 66 generates the INTERNAL CLOCK signal for the chip 52. The clock sample system 62 provides an output signal 64 indicative of the frequency of the INTERNAL CLOCK signal. The output signal 64 can be a P-bit digital word indicative of such frequency, where P is an integer ($P \geq 1$). The clock sample system 62 can be the same or different from the clock sample system 56.

The frequency comparator 60 compares the frequency information signals 58 and 64 and generates a comparator output signal 68 that is provided to the oscillator/control system 66. The comparator output signal 68, for example, provides an indication as to whether the internal clock frequency should be increased, decreased or that no change is necessary. The comparator output signal 68 can be a Q-bit word, where Q is an integer ($Q \geq 1$).

The SYNC INPUT signal may correspond to a reference signal for synchronizing the INTERNAL CLOCK signal to a desired frequency, which may be equal to or proportional to the frequency of the SYNC INPUT signal. In a situation where oscillator/control system 66 is configured to provide the INTERNAL CLOCK signal, for example, at a frequency that is ten times greater than the frequency of the SYNC INPUT signal, the frequency comparator 60 can compare the relative output signals 58 and 64 to ascertain whether a desired frequency ratio (e.g., a 10:1 ratio) exists between the signals. That is, the frequency comparator 60 is not limited to generating the comparator output signal 68 for a synchronization scheme having a 1:1 ratio between the frequency of the SYNC INPUT signal and the INTERNAL CLOCK signal.

The oscillator/control system 66 can be configured to adjust the frequency of the INTERNAL CLOCK signal by switching in or out one or more components based on the comparator output signal 68. For example, the oscillator/control system 66 can decrease the frequency of the internal clock signal by adding delay elements into the path of the INTERNAL CLOCK signal. In contrast, the oscillator/control system 66 can remove delay elements to increase the frequency of the INTERNAL CLOCK signal. Thus, the oscillator/control system provides means for controlling an oscillator to adjust the frequency of the internal clock signal based on the comparator output signal 68.

By way of example, at power up for the chip 52, the oscillator/control system 66 can generate the INTERNAL CLOCK signal at a predetermined starting frequency. The oscillator/control system 66 may update the frequency of the INTERNAL CLOCK signal based on the comparator output signal 68 every S cycles, where S is positive integer ($S \geq 1$). The value of S can change as a function of the operating mode of the chip 52. For instance, S can be a lower during a start-up mode to implement updates to the frequency of the internal clock signal more rapidly, and then after the INTERNAL CLOCK signal has sufficiently stabilized, the value of S can be increased to implement less frequent updates (e.g., hundreds or thousands of cycles between updates). The frequency adjustments (e.g., an increase or decrease in frequency) can be an incremental with each update cycle.

Additionally, the oscillator/control system 66 can modify the frequency of updates as a function of process, voltage and/or temperature conditions associated with the chip 52 or the environment in which the chip is implemented. For example, different chips across a circuit board or an arrangement of circuit boards may experience different voltage and temperature conditions, such as depending on their activity level, location relative to power supplies or heat sinks and the like. Additionally, different chips can experience different process variations during fabrication that can affect their operation. Thus, the oscillator/control system 66 can further control the update interval for the frequency of the INTERNAL CLOCK signal according to changes in the operating (e.g., voltage or temperature) conditions associated with the chip 52.

Alternatively or additionally, the chip 52 may operate as a master chip that provides its INTERNAL CLOCK signal at an output 70, which operates as a SYNC INPUT signal for synchronizing one or more other chips electrically coupled to the output 70. In this case, it may be desirable to have the chip 52 adjust its INTERNAL CLOCK signal, such as by implementing process, voltage and temperature compensation. In this way, the INTERNAL CLOCK signal can be provided to the other chips at a desired substantially stable frequency for synchronization. Such an approach can be utilized in a system where a stable clock frequency is desired. Yet another alternative approach is to allow the frequency of the synchronization signal provided by the master chip to fluctuate and, in turn, employ synchronization as described herein to enable the associated chips to adjust their frequency to synchronize with the variable SYNC INPUT signal.

Figure 3:
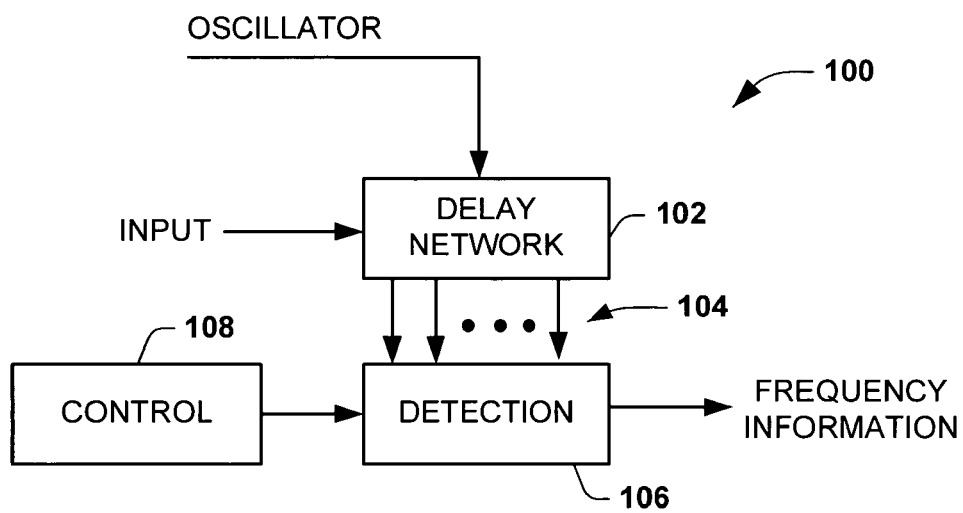
FIG. 3 depicts an example of a sampling system that can be implemented in a synchronization system.

FIG. 3 depicts an example of one embodiment of a sampling system 100 that can be utilized as part of a synchronization system. The sampling system 100 includes a delay network 102 that receives an INPUT signal. The delay network 102 is clocked by an OSCILLATOR signal that enables the input signal to propagate through a plurality of delay elements (not shown) in the delay network 102. The respective delay elements provide corresponding output signals 104 to a detection block 106.

For example, each delay element implements a known delay on the INPUT signal such that each of the respective delay output signals 104 corresponds to a different portion of the INPUT signal according to the delay associated with each element. In this way, the output signals 104 provide a sampling at different spaced apart time intervals of the INPUT signal. As a result, the detection block 106 can determine a time interval between state changes in the INPUT signal. Since the amount of delay implemented within the delay network 102 is known for each of the output signals 104, the detection block 106 can determine the period for the INPUT signal based on the time interval between state changes. The detection block 106 further can convert the period to provide an indication of the frequency for the INPUT signal (FREQUENCY INFORMATION).

A control block 108 controls the detection block 106 to provide the FREQUENCY INFORMATION based on a current state of the delay output signals 104. For example, the control block 108 can provide a control signal at a desired rate, which can be fixed or variable depending on the desired implementation. To facilitate providing accurate FREQUENCY INFORMATION for the INPUT signal, the control block 108 may be configured to enable the output signals detected by the detection block to perform at least four times over sampling of the INPUT signal. The detection block 106 can provide the FREQUENCY INFORMATION as multi-bit data having a value indicative of the frequency of the INPUT signal derived from the output signals 104.

Figure 4:
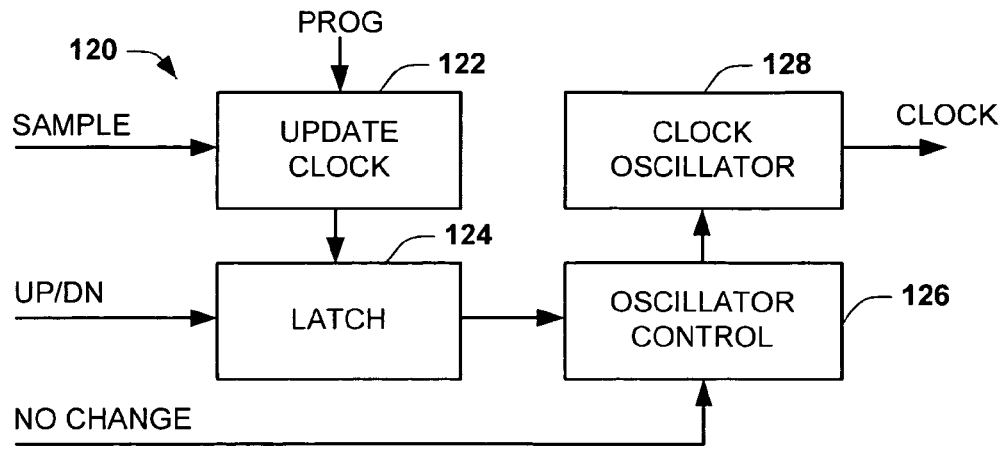
FIG. 4 depicts an example of an oscillator/control system that can be implemented in a synchronization system.

FIG. 4 depicts an example of one embodiment of an oscillator/control system 120 that can be utilized in a synchronization system. The system 120 includes an update clock 122 that receives a SAMPLE signal indicative of a sample rate. For example, the SAMPLE signal can be used to set a sampling rate for associated sampling circuitry (not shown). The update clock 122 provides an output signal that controls how often a CLOCK signal is updated, such as based on the SAMPLE signal. The update clock can also receive a program (PROG) signal that can be set to control the interval between updates, such as based on a number of cycles of the SAMPLE signal. The PROG signal can be set to a fixed value, which can be programmed by a designer or based on detecting local operating characteristics (e.g., voltage, temperature, and the like). Additionally or alternatively, the PROG signal can be provided (e.g., by a controller) to adaptively select the interval between respective updates of the CLOCK frequency.

The update clock 122 provides its output signal to a latch 124. The latch 124 is coupled to propagate an UP/DN input signal to an oscillator control block 126 based on the output signal provided by the update clock. The UP/DN signal corresponds to control data indicating whether the CLOCK frequency should be increased or decreased, such as based on a comparison of frequency information for the CLOCK signal and frequency information for an external reference signal.

The oscillator control block 126 receives the latched UP/DN signal and a NO CHANGE signal. The NO CHANGE signal corresponds to control data indicating that no change to the CLOCK signal is required. While the UP/DN signal and the NO CHANGE signal are depicted as separate signals provided to the oscillator control block 126, a single multi-bit signal can be utilized, such as provided through the latch 124. The oscillator control block 126 controls a clock oscillator 128 based on the latched UP/DN and NO CHANGE signals. Thus, the oscillator control block 126 provides means for controlling the oscillator 128 to adjust the frequency of the internal clock signal based on the latched UP/DN and NO CHANGE signals, which as mentioned above, can be based on a comparison of frequency information for the CLOCK signal and frequency information for an external reference signal. For example, the oscillator control block 126 provides multi-bit data to the clock oscillator 128. The control data, for example, may result in one or more components being selectively switched into and/or out of the clock oscillator 128. The clock oscillator 128 in turn provides the CLOCK signal with a frequency based on the control data provided by the oscillator control block 126.

FIG. 5 illustrates an IC chip 150 implementing another embodiment of a synchronization system 152. In this example, the chip 150 includes an input (SYNC INPUT) 154 that receives an external REFERENCE signal having a frequency to which the internal CLOCK of the chip 150 is to synchronize. As mentioned above, the REFERENCE signal can be a substantially fixed frequency or it can be variable, such as adapting according to operating conditions (e.g., temperature or voltage) of the external source of the REFERENCE signal.

The synchronization system 152 includes a clock sample system 156 that receives the reference signal. The clock sample system 156 provides an output signal 158 indicative of the frequency of the reference signal. For example, clock sample system 156 provides the output signal 158 as a multi-bit data signal to a frequency comparator 160. The clock sample system 156 can sample the REFERENCE signal by employing at least four times oversampling.

The frequency comparator 160 compares the frequency information of the output signal 158 with frequency information of an output signal 162 provided by a clock sample system 164. In particular, the clock sample system 164 determines frequency information for an internally generated CLOCK signal for the chip 150. The internal CLOCK signal can be distributed to various components across the chip 150, as is known in the art.

The frequency comparator 160 provides an output signal 166 indicative of the relative frequencies of the REFERENCE signal and the internal CLOCK signal to an oscillator/control system 168. The comparator output signal 166, for example, contains digital data indicating whether the frequency of the CLOCK signal should be increased, decreased or whether no change is needed for the CLOCK signal. The oscillator/control system 168 provides a PRE-CLOCK signal to a phase adjuster 170. The oscillator/control system 168 is programmed and/or configured to adjust the frequency (e.g., up or down) of the PRE-CLOCK signal based on the comparator signal 166. For example, the oscillator/control system 168 includes an oscillator that is controlled as a function of the comparator output signal 166. Such control can include adding or removing components in the path of the PRE-CLOCK signal to adapt the frequency of the PRE-CLOCK signal until it is substantially synchronized with the frequency of the REFERENCE signal. Additionally, the oscillator control system 168 may control the rate at which the comparator output signal is read for implementing updates on the CLOCK signal. The rate at which the frequency of the CLOCK signal is updated can be fixed or variable, such as according to the operating mode (e.g., power up or normal mode) of the chip as well as based on operating conditions (e.g., voltage and/or temperature) of the chip. Additionally, coarser adjustments may be made initially (e.g., at power up) than when operating in a normal mode.

In the example of FIG. 5, the synchronization system 152 also is operative to synchronize the phase of the CLOCK signal to that of the REFERENCE signal. The synchronization system 152 includes a phase detector 172 that receives the REFERENCE signal and the PRE-CLOCK signal. The phase detector 172 provides an output signal to the phase adjuster 170 indicative of relative phase characteristics, such as whether a phase lead or a phase lag exist between the PRE-CLOCK signal and the REFERENCE signal. The phase adjuster 170 in turn implements a phase adjustment on the PRE-CLOCK signal (e.g., a delay) based on the phase detection output signal 174.

For example, the phase adjuster 170 can include one or more delay elements (not shown) that can be switched in or out of the path between the PRE-CLOCK signal and the CLOCK signal to implement a desired amount of phase adjusted delay. The amount of delay is set to mitigate phase offset between the REFERENCE signal and the CLOCK signal. For example, the phase detection output signal 174 can be a one or more bit data stream that provides an indication as to whether the phase of the PRE-CLOCK signal should be adjusted (e.g., up, down or not changed). Additionally, the phase detection output signal can indicate an amount of delay to implement. The oscillator/control system 168 can also control the phase detector 172 to operate the phase detection and adjustment path at a desired rate. The rate at which the phase is updated, for example, can vary according to the operating mode of the chip 152 and/or associated operating characteristics of the chip.

The phase adjuster 170 can implement a default state in which the PRE-CLOCK signal is delayed an amount designed to compensate for insertion loss associated with the external REFERENCE signal propagating from the source of the REFERENCE signal to the chip 150, namely to the sync input 154. The synchronization system 152 can also include an insertion loss compensator 176. The insertion loss compensator 176 provides a compensation signal to the phase detector 172 that enables the phase detector 172 to adjust for insertion loss associated with the propagation of the external reference signal to the chip 150. Alternatively, as schematically indicated by a dotted line, the insertion loss compensator 176 can provide insertion loss data directly to the phase adjuster 170 to enable the phase adjuster to implement a corresponding amount of delay associated with the insertion loss, which can be separate from the phase adjustments based on the phase signal 174.

The insertion loss compensator 176 can be coupled to another input 178 of the chip 150. The input 178 can receive a signal that enables the insertion loss compensator 176 to determine an amount of insertion loss for the chip 150. For example, at power up for the chip 150, the other input 178 can be coupled to receive firmware information indicative of the configuration and design attributes associated with the circuitry in which the chip 150 is implemented. The insertion loss compensator 176 can employ the information to determine which of the plurality of predetermined insertion loss values are associated with the given design. For instance, the insertion loss compensator 176 can include a programmable register pre-programmed with insertion loss values for a plurality of different designs and board configurations. Thus, by receiving firmware instructions via the other input 178 an appropriate insertion loss value can be provided to the phase detector 172 (or to the phase adjuster 170). The phase detector 172 can utilize this to provide the phase detection output signal 174 to implement a corresponding initial phase adjustment by causing the phase adjuster 170 to tune in a corresponding amount of delay.

According to another possible implementation, the other input 178 can be coupled to a trace on the circuit board configured to substantially match physical characteristics for the trace from the source of the REFERENCE signal to the input 154. The insertion loss compensator 176 can provide a signal over this trace and determine an appropriate amount of insertion loss, such as at power-up, thereby operating as a timer circuit. Alternatively or additionally, the insertion loss compensator 176 can receive other information via the input 178 such as related to the process, voltage or temperature conditions for the chip 150. The insertion loss compensator 176 can employ this other information (e.g., during normal chip operation) to adjust the amount of insertion loss accordingly.

By way of further example, at power-up, the synchronization system 152 may first implement frequency adjustments at a predetermined update rate and, after the frequency has sufficiently stabilized, implement adjustments to the phase of the CLOCK signal. For instance, the oscillator/control system 168 may implement updates more rapidly (e.g., approximately every ten cycles) during a start-up mode to synchronize the frequency of the PRE-CLOCK signal to that of the REFERENCE signal. As mentioned above, the phase adjuster 170 can be preset to remove insertion loss, such as indicated by the insertion loss compensator 176 and/or the phase detector 172. After the frequency has stabilized to within adequate operating parameters, the phase detector 172 can be activated (e.g., by the oscillator/control system 168) to implement phase detection and phase correction for the internal CLOCK signal. Once the phase is properly aligned with the phase of the external reference signal, the update rates for the phase and frequency of the CLOCK signal can be reduced.

Figure 6:
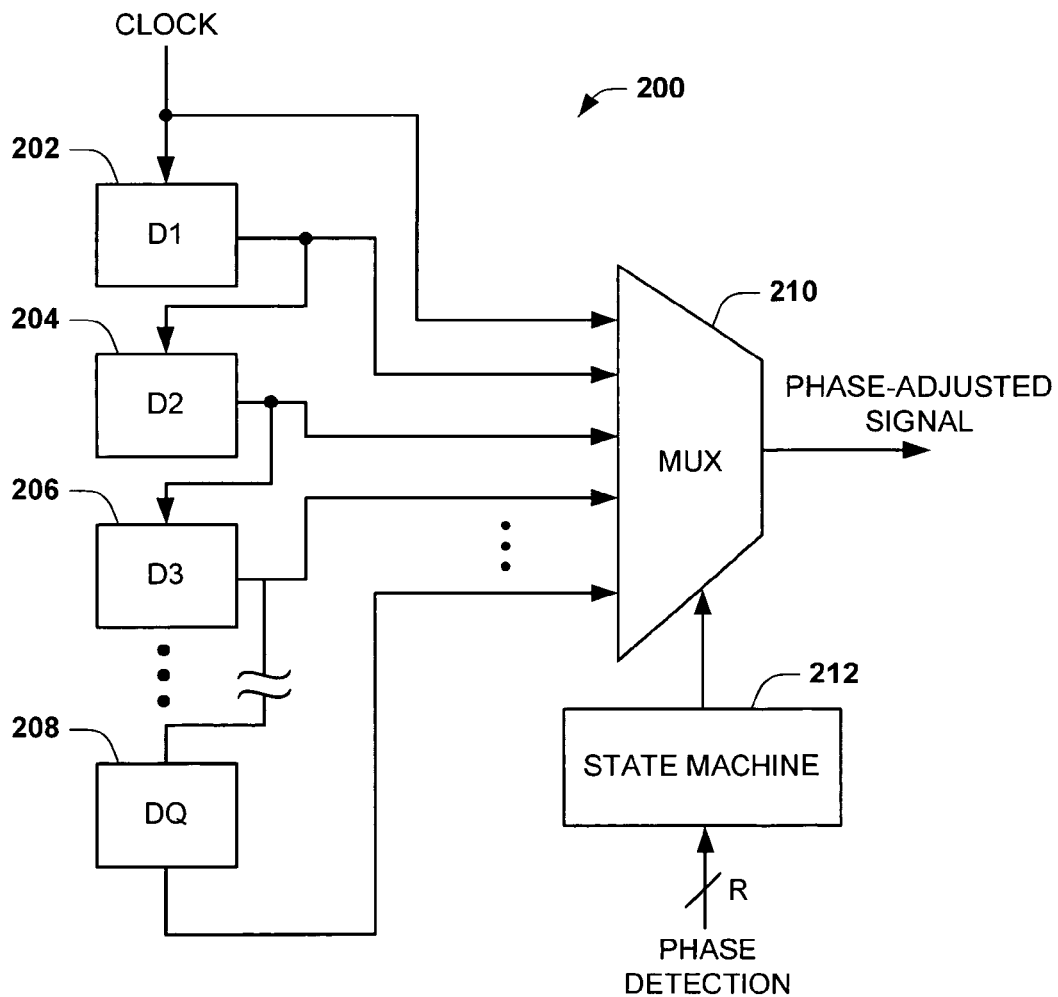
FIG. 6 depicts an example of a phase adjuster that can be utilized in a synchronization system.

FIG. 6 illustrates an example of one embodiment of a phase adjuster 200 that can be employed in a synchronization system, such as to implement phase adjustments to a CLOCK signal. The phase adjuster 200 includes a plurality of delay elements 202, 204, 206 and 208, indicated at D1 through DQ, where Q is an integer denoting the number of delay elements ($Q \geq 1$). There can be any number Q of delay elements to provide a desired resolution for adjusting the phase of the CLOCK signal. The delay elements 202–208 can be any device operative to impose delay on a CLOCK signal, such as RC elements, inverters, metal lines, buffers, discrete logic gates and the like. The amount of delay implemented by the respective delay elements 202–208 can be the same or different depending on the configuration of the phase adjuster 200 and desired resolution.

In the example of FIG. 6, the system CLOCK signal is provided to an input of the delay element 202 and to an input of a multiplexer 210. The output signal of the delay element 202 provides an output signal to the input of the delay element 204 and directly to an input of the multiplexer 210. Similarly, the other delay elements 204–208 provide corresponding output signals to the multiplexer 210 as well to inputs of subsequent delay elements, except for the $Q^{th}$ delay element 208, which provides its output to the multiplexer.

A state machine 212 controls the multiplexer 210 to select a desired delayed version of the CLOCK input signal that is to be provided as a PHASE-ADJUSTED output signal. The state machine 212, for example, provides a control output signal to the multiplexer 210 corresponding to a value associated with a desired amount of delay based on a PHASE DETECTION input signal. For example, the PHASE DETECTION signal can include R bits of control information, such as indicating whether to adjust the phase up, down or not change the phase. The control information in the PHASE DETECTION signal can cause a counter value in the state machine 212 to increment and decrement accordingly, which results in corresponding control information being provided to the multiplexer 210. The multiplexer 210 in turn provides the PHASE-ADJUSTED signal having, for example, from no delay to an aggregate amount of delay provided by the delay elements 202–208.

Figure 7:
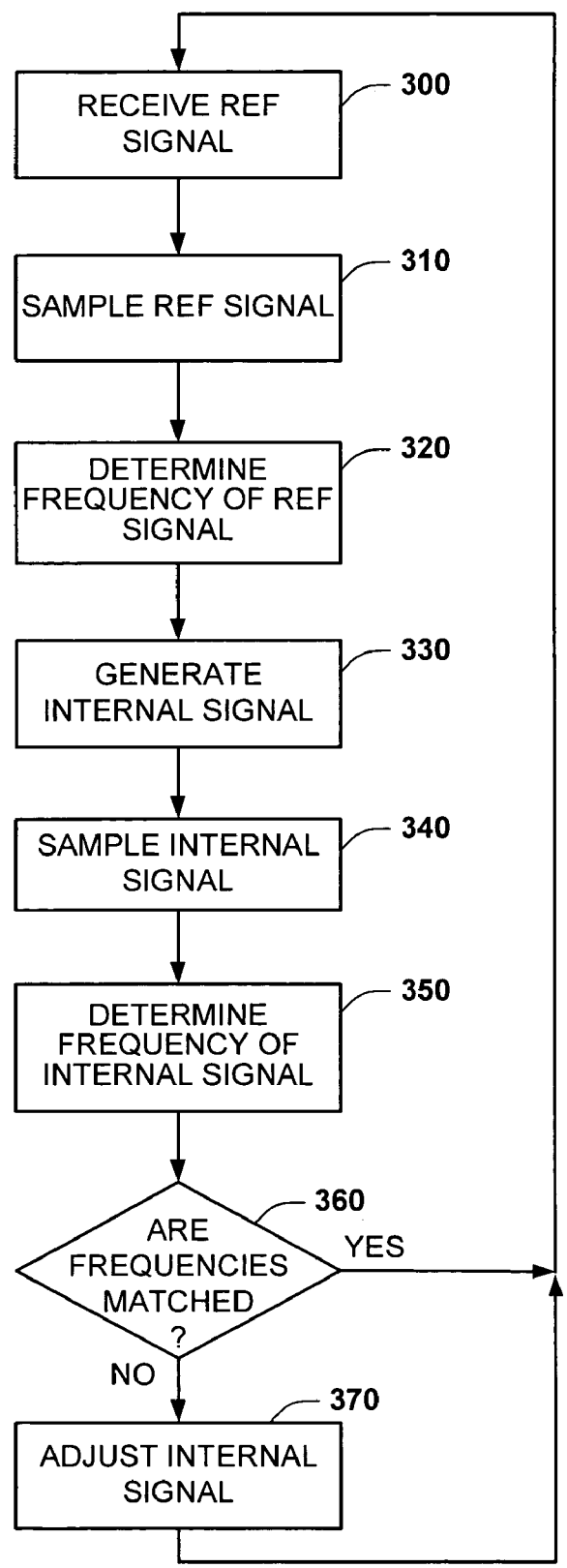
FIG. 7 is a flow diagram illustrating a methodology for synchronizing devices.
Figure 8:
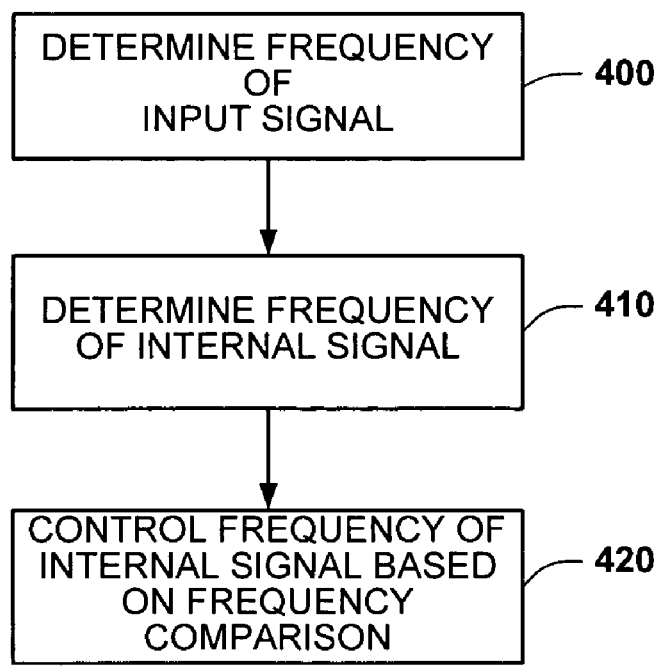
FIG. 8 is a flow diagram illustrating a methodology for synchronizing devices.

In view of the foregoing structural and functional features described above, certain synchronization methodologies that can be implemented will be better appreciated with reference to FIGS. 7 and 8. While, for purposes of simplicity of explanation, the methodologies of FIGS. 7 and 8 is shown and described as being implemented serially, it is to be understood and appreciated that the illustrated actions, in other embodiments, may occur in different orders and/or concurrently with other actions. Moreover, not all illustrated features may be required to implement a methodology. It is to be further understood that the following methodologies can be implemented in hardware, such as one or more integrated circuits, software, or any combination thereof.

FIG. 7 depicts an embodiment of a methodology that can be utilized to synchronize a device, such as a chip, relative to an external reference (REF) signal, such as a synchronization signal provided by another chip on a circuit board or other integrated system. The methodology begins at 300 in which an externally provided reference signal is received. At 310, the reference signal is sampled. For example, the sampling can include at least four times oversampling, such as to enable detection of adjacent rise and fall times. At 320, the frequency of the reference signal is determined to provide an indication of frequency (e.g., digital data) for the received signal. The frequency determination (at 320) can correspond to providing a multi-bit value indicative of the frequency of the received signal based on the sampling (at 310).

At 330, an internal signal, such as a clock signal, is generated within the chip implementing the synchronization methodology. The signal is generated (e.g., by an oscillator) having a frequency that may differ from the frequency of the received signal (at 300). At 340, the internally generated signal is sampled. The sampling, for example, includes at least four times over sampling. At 350, the frequency of the internal signal is determined, such as to provide a digital value indicative of the frequency of the internal signal. The frequency information can be derived from detecting adjacent rise and fall times in the internally generated signal based on the sampled portions of the signal.

At 360, a determination is made as to whether the frequency of the received signal and the frequency of the internally generated signal are matched. By matched, the frequencies can be equal or have a desired proportional relationship (e.g., a ratio) depending on the desired frequency of the internal signal relative to the reference signal. For example, a methodology can be employed to synchronize the internally generated signal to have a frequency equal to the frequency of the signal received at 300 or, alternatively, to have a frequency that is a proportional multiple of the received signal. If the frequencies are matched (YES), indicating that no frequency change is needed, the methodology returns to 300 to repeat the foregoing actions.

In the event that the frequencies are not matched (NO), the methodology proceeds to 370. At 370, the frequency of the internal signal is adjusted. For example, if the frequency of the internal signal is determined at 360 to be too high, the frequency of the internal signal can be decreased at 370. Alternatively, if the internal signal is determined to have too low of a frequency, the frequency of the internal signal can be increased at 370.

FIG. 8 depicts one embodiment of a method that comprises determining an indication of frequency for an input signal provided by an external source, as shown at 400. The method also includes determining an indication of frequency for an internally generated signal, as shown at 410. The method further includes controlling an oscillator to provide the internally generated signal at a frequency based on a comparison of the indication of frequency for the input signal and the indication of frequency for an internally generated input signal, as shown at 420.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system, comprising:
   an input that receives a synchronization signal having a frequency;
   an oscillator/control system that provides a clock signal having a frequency, the oscillator/control system adjusts the clock signal based on a comparison of the frequency for the synchronization signal and the frequency for the clock signal;
a sampling system comprising a delay network that provides plural output signals that capture different parts of the clock signal,
a first sampling system that provides a digital indication of the frequency for the synchronization signal; and
a second sampling system that provides a digital indication of the frequency for the clock signal, the oscillator/control system adjusting the clock signal based on the plural output signals based on a comparison between the indication of frequency for the clock signal and the indication of the frequency for the synchronization signal.

2. The system of claim 1, wherein each of the first and second sampling systems performs respective oversampling at a rate that is at least four times that of the synchronization signal.

3. The system of claim 1, further comprising a comparator that compares the indication of the frequency for the clock signal and the indication of the frequency for the synchronization signal and provides a comparator output signal having a value indicating a desired one of an incremental increase, an incremental decrease and a no-change condition for the frequency of the clock signal, the oscillator/control system adjusting the frequency of the clock signal based on the comparator output signal.

4. A system, comprising:
an input that receives a synchronization signal having a frequency;
an oscillator/control system that provides a clock signal having a frequency, the oscillator/control system adjusts the clock signal based on a comparison of the frequency for the synchronization signal and the frequency for the clock signal;
a sampling system that comprises a delay network that provides plural output signals that capture different parts of the clock signal, the sampling system provides the corresponding indication of frequency for the clock signal based on the plural output signals;
a phase detector that compares the phase of the synchronization signal relative to the phase of the clock signal to provide a phase signal; and
a phase adjuster that delays the clock signal by an amount based on the phase signal.

5. The system of claim 4, further comprising an insertion loss compensator that provides a compensation signal indicative of insertion loss associated with the propagation of the synchronization signal to the input to facilitate phase adjustments to the clock signal.

6. A system, comprising:
an input that receives a synchronization signal having a frequency;
an oscillator/control system that provides a clock signal having a frequency, the oscillator/control system adjusts the clock signal based on a comparison of the frequency for the synchronization signal and the frequency for the clock signal;
a sampling system that comprises a delay network that provides plural output signals that capture different parts of the clock signal, the sampling system provides the corresponding indication of frequency for the clock signal based on the plural output signals; and
an update control that sets a variable rate for updating the frequency of the clock signal, the oscillator/control system adjusting the clock signal at an update interval corresponding to the variable rate set by the update control.

7. The system of claim 6, wherein the update control sets the rate for updating the frequency of the clock signal based on at least one operating characteristic of an integrated circuit chip comprising the system.

8. The system of claim 6 implemented on an integrated circuit chip.

9. An integrated system comprising n integrated circuit chips, where n is a positive integer denoting the number of integrated circuit chips, at least n-1 of the integrated circuit chips comprising the system of claim 6, and at least one other of the integrated circuit chips providing the synchronization signal to the n-1 of the integrated circuit chips.

10. A system for synchronizing an integrated circuit (IC) chip, comprising:
a first sampling system that provides an indication of the frequency for a synchronization signal received at an input of the IC chip;
a second sampling system that provides an indication of frequency for an internally generated clock signal;
a comparator that provides a comparator signal based on a comparison of the indication of frequency for the clock signal and the indication of the frequency for the synchronization signal;
a controller that provides a control signal for implementing the adjustment to the internally generated clock signal based on the comparator signal; and
an oscillator that adjusts the frequency of the internally generated clock signal based on the control signal;
wherein at least one of the first and second sampling systems comprises:
a delay network that provides plural output signals corresponding to different parts of a respective signal sampled by the at least one of the first and second sampling systems; and
a detection system that derives an indication of frequency for the respective signal sampled by the at least one of the first and second sampling systems based on the plural output signals.

11. The system of claim 10, wherein the indication of frequency for each of the synchronization signal and the clock signal comprises a respective digital value, the comparator providing the comparator signal having a value that indicates one of an incremental increase, an incremental decrease and a no-change condition for the frequency of the clock signal.

12. The system of claim 10, further comprising:
a phase detector that compares the phase of the synchronization signal relative to the phase of the clock signal to provide a phase signal; and
a phase adjuster that delays the clock signal by an amount based on the phase signal for adjusting the phase of the clock signal to enable the system to provide a phase adjusted clock signal.

13. The system of claim 10, further comprising an insertion loss compensator that provides a compensation signal indicative of insertion loss associated with the propagation of the synchronization signal from an external source to the input of the IC chip to facilitate phase adjustments to the clock signal.

14. The system of claim 10, further comprising an update control that controls a rate at which the frequency of the clock signal is updated.

15. The system of claim 10, wherein the oscillator adjusts the phase of the internally generated clock signal based on the control signal by at least one of switching at least one component into or out of the oscillator.

16. A synchronization system, comprising:
means for comparing an indication of frequency of an external reference signal and an indication of frequency of an internal clock signal;
means for controlling oscillating means to provide the internal clock signal at a frequency based on the comparison of the external reference signal and the internal clock signal;
means for comparing phase characteristics of the external reference signal and the internal clock signal to provide a phase signal;
means for adjusting phase of the internal clock signal based on the phase signal; and
means for compensating for insertion loss associated with propagation of the external reference signal from a source to an input of the system that receives the external reference signal.

17. The system of claim 16, further comprising the oscillating means for providing the internal clock signal based on control implemented by the means for controlling, the oscillating means adjusting the frequency of the internal clock signal by switching at least one component into and/or out of the oscillating means.

18. The system of claim 16, further comprising:
means for sampling the external reference signal to provide the indication of frequency of the external reference signal; and
means for sampling the internal clock signal to provide the indication of frequency of the internal clock signal.

19. The system of claim 16, further comprising means for updating the indication of frequency at an update rate to enable the means for controlling to implement adjustments to the frequency of the internal clock signal.

20. A method, comprising:
determining an indication of frequency for an input signal provided by an external source;
determining an indication of frequency for an internally generated signal;
controlling an oscillator to provide the internally generated signal at a frequency based on a comparison of the indication of frequency for the input signal and the indication of frequency for the internally generated signal;
adjusting the frequency of the internally generated signal; and
implementing insertion loss compensation associated with propagation of the input signal from the external source to an input of an integrated circuit implementing the method.

21. The method of claim 20 further comprising:
sampling the input signal to provide an input sample signal, the indication of frequency for the input signal being determined based on the input sample signal; and
sampling the internally generated signal to provide a clock sample signal, the indication of frequency for the internally generated signal being determined based on the clock sample signal.

22. The method of claim 21,
wherein the sampling of the input signal further comprises delaying the input signal to provide plural delayed signals corresponding different instances of the input signal based on which the indication of frequency for the input signal is determined; and wherein the sampling of the internally generated signal further comprises delaying the internally generated signal to provide plural delayed signals corresponding to different instances of the internally generated signal based on which the indication of frequency for the internally generated signal is determined.

23. The method of claim 20, wherein the controlling further comprises providing at least one control signal to cause the oscillator to one of increase, decrease and not change the frequency of the internally generated signal.

24. The method of claim 20, further comprising:
comparing phase characteristics of the input signal and the internally generated signal to provide a phase signal; and
delaying the internally generated signal based on the phase signal to provide a phase adjusted internally generated signal.

25. The method of claim 20, further comprising controlling an update rate at which the adjustments to the frequency of the internal clock signal are performed.

26. A system for synchronizing an integrated circuit (IC) chip, comprising:
a first sampling system that provides an indication of the frequency for a synchronization signal received at an input of the IC chip;
a second sampling system that provides an indication of frequency for an internally generated clock signal;
a comparator that provides a comparator signal based on a comparison of the indication of frequency for the clock signal and the indication of the frequency for the synchronization signal;
a controller that provides a control signal for implementing the adjustment to the internally generated clock signal based on the comparator signal;
an oscillator that adjusts the frequency of the internally generated clock signal based on the control signal by at least one of switching at least one component into or out of the oscillator; and
an update control that controls a variable update interval at which the frequency of the clock signal is updated, the oscillator adjusting the frequency of the internally generated clock signal at the update interval.

27. A system, comprising:
an input that receives a synchronization signal having a frequency;
an oscillator/control system that provides a clock signal having a frequency, the oscillator/control system adjusts the clock signal by one of switching in and out at least one component in the path of the clock signal based on a comparison of the frequency for the synchronization signal and the frequency for the clock signal;
a sampling system that comprises a delay network that provides plural output signals that capture different parts of the clock signal, the sampling system provides the corresponding indication of frequency for the clock signal based on the plural output signals;
wherein the oscillator/control system adjusts the clock signal by one of switching in and out at least one component in the path of the clock signal.

* * * * *